US008613413B2

(12) United States Patent
Chen

(10) Patent No.: US 8,613,413 B2
(45) Date of Patent: Dec. 24, 2013

(54) COMPACT TYPE FINE-TUNING LIFTER

(75) Inventor: Hwa-Fu Chen, Hsinchu (TW)

(73) Assignee: Leading Precision Inc., Jhunan Township, Miaoli County (TW)

( * ) Notice: Subject to any disclaimer, the term of this patent is extended or adjusted under 35 U.S.C. 154(b) by 141 days.

(21) Appl. No.: 13/239,783

(22) Filed: Sep. 22, 2011

(65) Prior Publication Data

US 2012/0273645 A1 Nov. 1, 2012

(30) Foreign Application Priority Data

Apr. 29, 2011 (TW) .............................. 100115141 A

(51) Int. Cl.
*F16M 11/24* (2006.01)

(52) U.S. Cl.
USPC ............... 248/188.4; 248/346.06; 248/657; 254/85

(58) Field of Classification Search
USPC ............ 248/188.4, 346.05, 346.06, 657, 661, 248/476, 70, 188.2; 254/84, 85
See application file for complete search history.

(56) References Cited

U.S. PATENT DOCUMENTS

| 1,337,065 | A | * | 4/1920 | Garcia | 254/85 |
| 1,987,726 | A | * | 1/1935 | Wilkerson et al. | 248/657 |
| 3,089,680 | A | * | 5/1963 | Deve | 254/85 |
| 3,306,562 | A | * | 2/1967 | Bellefleur | 248/188.2 |
| 3,796,276 | A | * | 3/1974 | Maeda | 180/8.5 |
| 4,858,865 | A | * | 8/1989 | Schrepfer | 248/188.2 |
| 4,934,647 | A | * | 6/1990 | Edwards | 248/371 |
| 5,303,035 | A | * | 4/1994 | Luecke et al. | 356/399 |
| RE35,907 | E | * | 9/1998 | Obrecht | 248/657 |
| 6,068,234 | A | * | 5/2000 | Keus | 248/637 |
| 6,323,903 | B1 | * | 11/2001 | Poulsen et al. | 348/373 |
| 7,328,879 | B1 | * | 2/2008 | Plangetis | 248/679 |
| 7,688,528 | B2 | * | 3/2010 | Michael et al. | 359/811 |
| 7,905,465 | B1 | * | 3/2011 | Anwar | 248/673 |
| 7,922,139 | B2 | * | 4/2011 | Dittmer et al. | 248/325 |
| 2005/0214083 | A1 | * | 9/2005 | Chen | 408/89 |
| 2008/0011912 | A1 | * | 1/2008 | Liao | 248/125.2 |

FOREIGN PATENT DOCUMENTS

TW        M378072        4/2010

* cited by examiner

*Primary Examiner* — Bradley Duckworth
(74) *Attorney, Agent, or Firm* — Hamre, Schumann, Mueller & Larson, P.C.

(57) ABSTRACT

A compact type fine-tuning lifter, which may have a volume of 8 cm×5 cm×4 cm and is able to support an article with the weight of several hundreds of kilograms, and can achieve a fine-tuning of micrometer scale. The lifter can achieve the efficacies of miniaturization, fine-tuning and low-cost by utilizing the combination of simple mechanisms comprising a base, a sliding seat, a sliding block and an adjustable screw bolt to perform the fine tuning in X-axis, Y-axis and Z-axis directions, respectively, to position the adjustable screw bolt. The present invention also relates to a use of the lifter.

4 Claims, 7 Drawing Sheets

COMPACT TYPE FINE-TUNING LIFTER

BACKGROUND OF THE INVENTION

1. Field of the Invention

The invention relates to a compact type fine-tuning lifter and use of the same, and more particularly, to a compact type fine-tuning lifter that can perform a fine tuning in the X-axis, Y-axis and Z-axis directions, respectively, to assist the connection between chambers of a semiconductor apparatus.

2. Description of Related Art

In semiconductor processes, in order to form films of various characteristics such as conductive film, anti-reflection film or reaction film, it is common to use vacuum coating processes such as PVD (physical vapor deposition), CVD (chemical vapor deposition) and etc. High degree of vacuum (degree of cleanness) is needed to efficiently operate the aforesaid processes and ensure the quality of the films.

Vacuum processing apparatus can be roughly classified into a cluster type and a linear type. The cluster type indicates that a transfer chamber (having transport mechanism, such as a robot arm) is surrounded by different processing chambers. The linear type indicates that different processing chambers are arranged in a linear link.

No matter which type of vacuum processing apparatus is used, chambers must be connected with each other to achieve air-tight effect. Therefore, in general, chambers will be screwed to each other tightly by a number of screws (e.g. M8 screws).

During screwing process, because of the problem of the manufacturing tolerance, every screw is not always able to be smoothly screwed into the corresponding threaded holes. Therefore, when screwing the chambers together, the positions of the chambers must be adjusted by slightly lifting up or shifting the chambers. This action must be repeated continuously until the chambers are adjusted to suitable positions so as to smoothly screw the screws into the corresponding threaded holes.

However, because the chamber has a large size and specific weight, for example several hundreds of kilograms, lifting up or shifting the chamber must take much manpower to move and adjust the position of the chamber.

In addition, moving and adjusting the position of the chamber manually not only wastes manpower but also may easily cause the problem that the moved distance is too much or too few when moving the chamber. In other word, workers must continuously try to move the chamber and repeatedly adjust the position of the chamber so as to smoothly screw the screws into the corresponding threaded holes.

Although conventional jack can be used to support a heavy article, other related devices and tubes exist around the chambers and often there is no space to use a common jack accordingly.

Further, although the screws can be screwed into corresponding threaded holes after the chamber is lifted up slightly, the chamber is very heavy as described above so that after the chamber is lifted up slightly and connected with an adjacent chamber, the lifted chamber will be tilted and in a partially suspended condition. Because the screws must support the weight of the chamber, they will cause bending effect. After used in this condition for a long time, the screws will be bended and even be broken so that air-tight effect within the chambers can not be achieved, and more worse, the damage of the chamber will occur.

Aforesaid problem has existed for a long time but still can not be solved efficiently because people still think that it is acceptable as long as the screws can be screwed smoothly and the chambers can meet the requirement of air-tight effect when connecting the chambers, without considering or facing the following problems such as bending and fracture of the screws and damage of the chambers. Hence, although it seems that there is no problem when connecting the chambers, the sequent effect still can not be ignored.

SUMMARY OF THE INVENTION

The purpose of the invention is to solve the above-mentioned problem and provide a compact type fine-tuning lifter which has elements for performing a fine tuning in an X-axis, a Y-axis and a Z-axis directions, respectively, to support a heavy article.

In other word, the compact type fine-tuning lifter of the invention defines an X-axis, a Y-axis and a Z-axis directions and this compact type fine-tuning lifter comprises a base, a sliding seat, a sliding block and an adjustable screw bolt, wherein the base has a upper opening on its upper surface and a lower opening on its bottom surface, corresponding to the upper opening; the sliding seat is slidably mounted on the base in the X-axis direction and has a sliding slot; the sliding block is slidably mounted on the sliding seat in the Y-axis direction and has a threaded hole; the adjustable screw bolt is screwed into the threaded hole along the Z-axis direction via the lower opening and the upper opening through the sliding slot, whereby the compact type fine-tuning lifter can perform the fine tuning in the X-axis, Y-axis and Z-axis directions, respectively, to support a heavy article.

Further, the base of the compact type fine-tuning lifter provided by the invention comprises a slot hole and at least one fixing seat, the slot hole being open along the X-axis and Y-axis and dividing the base into a upper base portion and a lower base portion along the Z-axis direction, the upper base portion including a first sliding rail, a plurality of first screws and an upper opening, the lower base portion including a lower opening, wherein the first sliding rail extends along the X-axis direction and includes a plurality of first threaded holes, the first threaded holes being open along the Y-axis direction, the first screws being screwed into the first threaded holes respectively, the upper opening being open along the Z-axis direction, the lower opening also being open along the Z-axis direction and corresponding to the upper opening, the at least one fixing seat extending outwardly from the base.

The sliding seat of the compact type fine-tuning lifter is slidably mounted on the first sliding rail and abuts against the corresponding first screws, and the sliding seat includes a second sliding rail, a plurality of second screws and a sliding slot, wherein the second sliding rail extends along the Y-axis direction and includes a plurality of second threaded holes, the second threaded holes being open along the X-axis direction, the second screws being screwed into the second threaded holes respectively, the sliding slot being open along the Z-axis direction, extending along the Y-axis direction and corresponding to the upper opening.

The sliding block of the compact type fine-tuning lifter is slidably mounted on the second sliding rail and abuts against the corresponding second screws, the sliding block including a threaded hole, the threaded hole being open along the Z-axis direction.

The adjustable screw bolt of the compact type fine-tuning lifter is screwed into the threaded hole along the Z-axis direction via the lower opening and the upper opening through the sliding slot.

Therefore, the lifter can achieve the efficacies of miniaturization, fine-tuning and low-cost by utilizing the combination of simple mechanical elements comprising a base, a sliding seat, a sliding block and an adjustable screw bolt to perform a fine tuning in the X-axis, Y-axis and Z-axis directions, respectively so as to position the adjustable screw bolt to support a heavy article.

The invention is also related to a utilization of a compact type fine-tuning lifter used in a semiconductor apparatus to assist the connection between chambers and the support of the chambers by performing the fine tuning in an X-axis, a Y-axis and a Z-axis directions, respectively.

DETAILED DESCRIPTION OF THE INVENTION

The compact type fine-tuning lifter of the invention has elements performing the fine tuning in an X-axis, a Y-axis and a Z-axis directions respectively to support a heavy article. With respect to utilization, the compact type fine-tuning lifter of the invention can be used in a semiconductor apparatus to assist the connection of and the support of chambers. Detailed explanation companying the figures is as follows.

Figure 1:
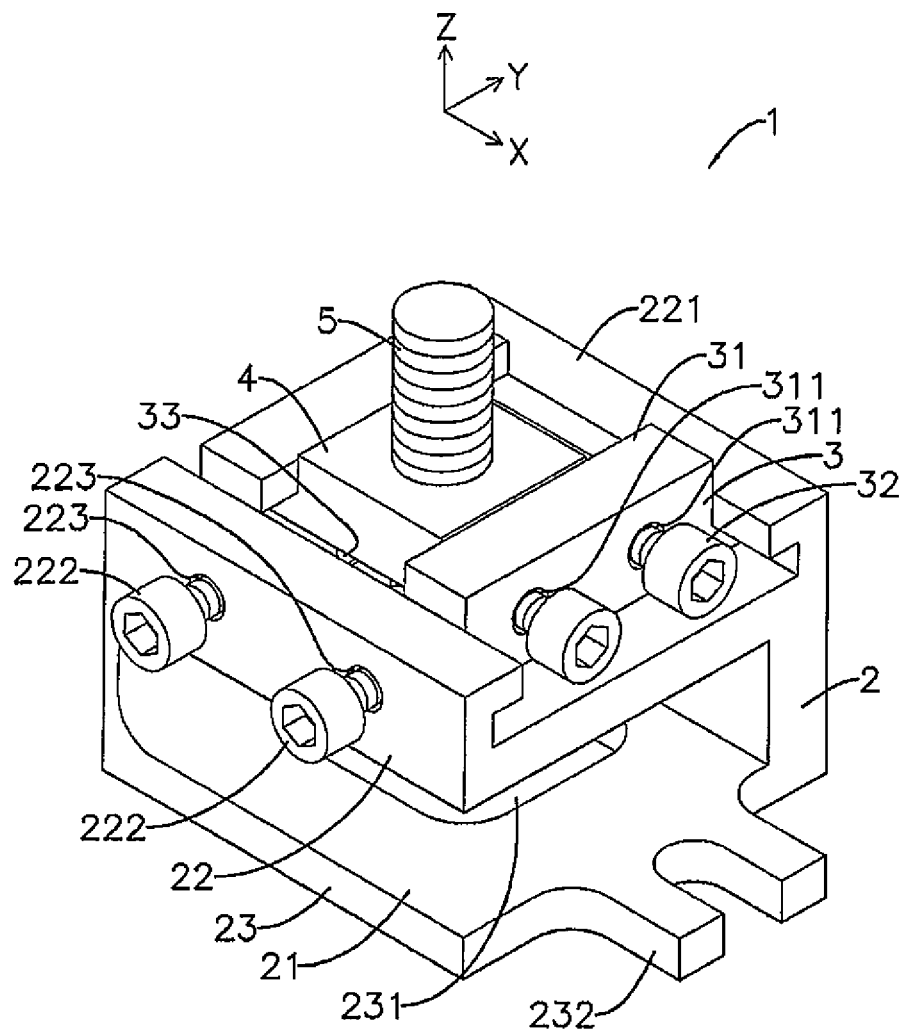
FIG. 1 is a perspective view of a first preferred embodiment according to the invention.
Figure 2:
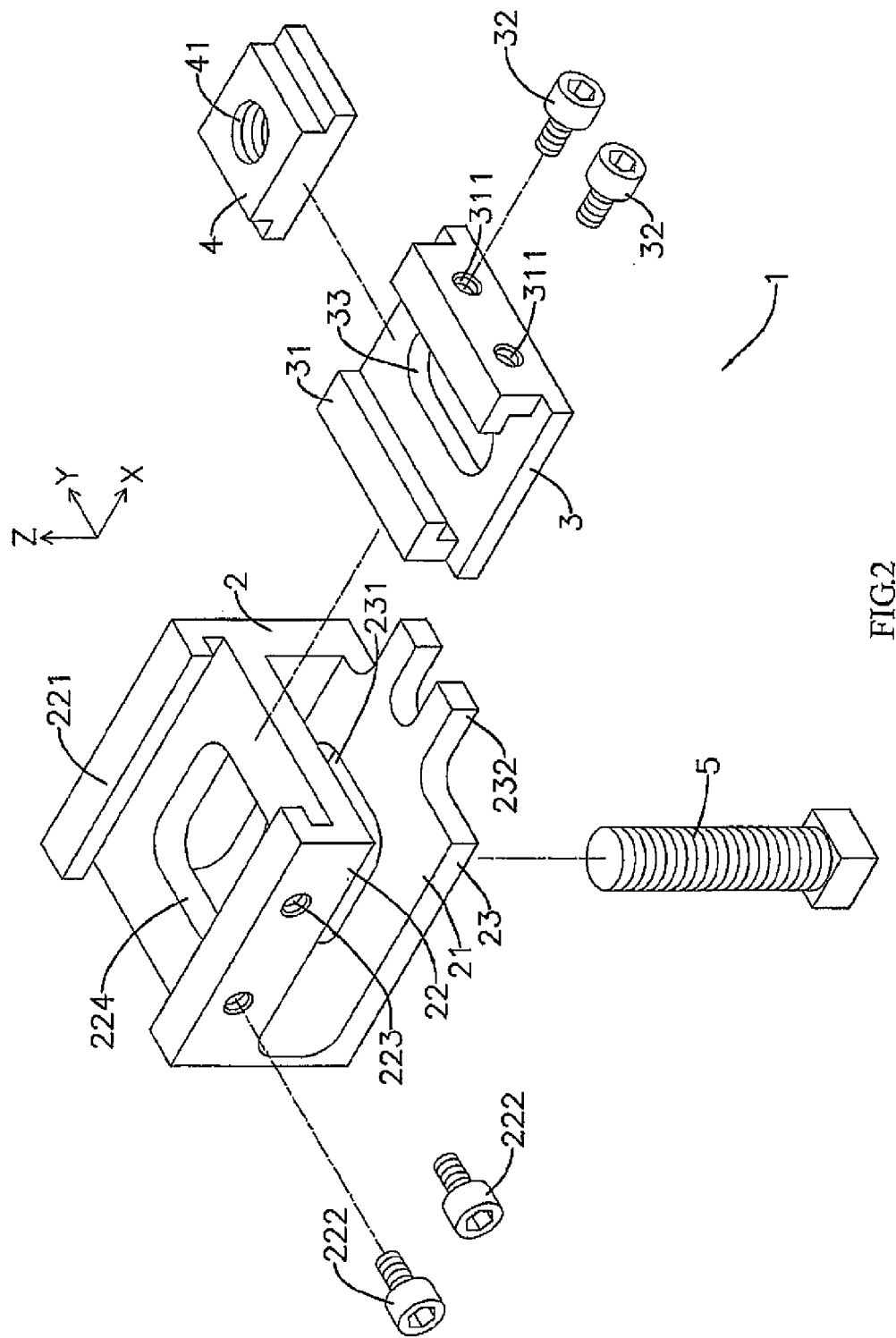
FIG. 2 is an exploded perspective view of FIG. 1.

Please refer to FIG. 1 and FIG. 2, wherein FIG. 1 is a perspective view of the first preferred embodiment according to the invention and FIG. 2 is an exploded perspective view of FIG. 1.

As illustrated in figures, there is a compact type fine-tuning lifter 1 defining an X-axis, a Y-axis and a Z-axis directions and comprising a base 2, a sliding seat 3, a sliding block 4, and an adjustable screw bolt 5.

The base 2 in the figures comprises a slot hole 21 and a plurality of fixing seats 232. The slot hole 21 is open to the X-axis and Y-axis directions and divides the base 2 into an upper base portion 22 and a lower base portion 23 along the Z-axis direction. The upper base portion 22 comprises a first sliding rail 221 which comprises two separate left and right rail portions, a plurality of first screws 222 and an upper opening 224. The lower base portion 23 comprises a lower opening 231. The first sliding rail 221 extends along the X-axis direction and includes a plurality of first threaded holes 223. The first threaded holes 223 are open along the Y-axis direction. The first screws 222 are screwed into the first threaded holes 223 respectively. The upper opening 224 is open along the Z-axis direction. The lower opening 231 is open along the Z-axis direction and corresponds to the upper opening 224. The fixing seats 232 extend outwardly from the base 2. In the embodiment, the fixing seats 232 extend outwardly from the lower base portion 23.

In the embodiment, the number of the fixing seats 232 is two, which number, of course, can be one or more than two, and the fixing seats 232 extend outwardly from the lower base portion 23 of the base 2 along the X-axis direction, or can extend outwardly from the lower base portion 23 and/or the upper base portion 22 of the base 2 along the Y-axis and/or Z-axis direction when the number of the fixing seats 232 is more than two. Alternatively, some of the fixing seats 232 can for example extend along the X-axis direction and the others of the fixing seats 232 can extend along the Y-axis direction. The numbers of the first screws 222 and the first threaded holes 223 are two respectively, which number of course can be other number, and the first screws 222 can be manual screws.

In addition, the sliding seat 3 in the figures is slidably mounted on the first sliding rail 221 of the upper base portion 22 of the base 2 and abuts against the corresponding first screws 222. The sliding seat 3 includes a second sliding rail 31 which has two separate left and right rail portions, a plurality of second screws 32 and a sliding slot 33, wherein the second sliding rail 31 extends along the Y-axis direction. The sliding seat 3 includes a plurality of second threaded holes 311. The second threaded holes 311 are open along the X-axis direction. The second screws 32 are screwed into the second threaded holes 311, respectively. The sliding slot 33 is open along the Z-axis direction, extends along the Y-axis direction and corresponds to the upper opening 224 of the upper base portion 22.

In the embodiment, the numbers of the second screws 32 and the threaded holes 311 are two respectively which number of course can also be other number, and the second screws 32 can also be manual screws.

The sliding block 4 is slidably mounted on the second sliding rail 31 of the sliding seat 3 and abuts against the corresponding second screws 32. The sliding block 4 includes a threaded hole 41 which is open along the Z-axis direction. The adjustable screw bolt 5 in the embodiment is a M12 screw bolt which can of course be screw bolt of other sizes, and is screwed into the threaded hole 41 of the sliding block 4 along the Z-axis direction via the lower opening 231 and the upper opening 224 of the base 2 through the sliding slot 33 of the sliding seat 3.

Figure 3:
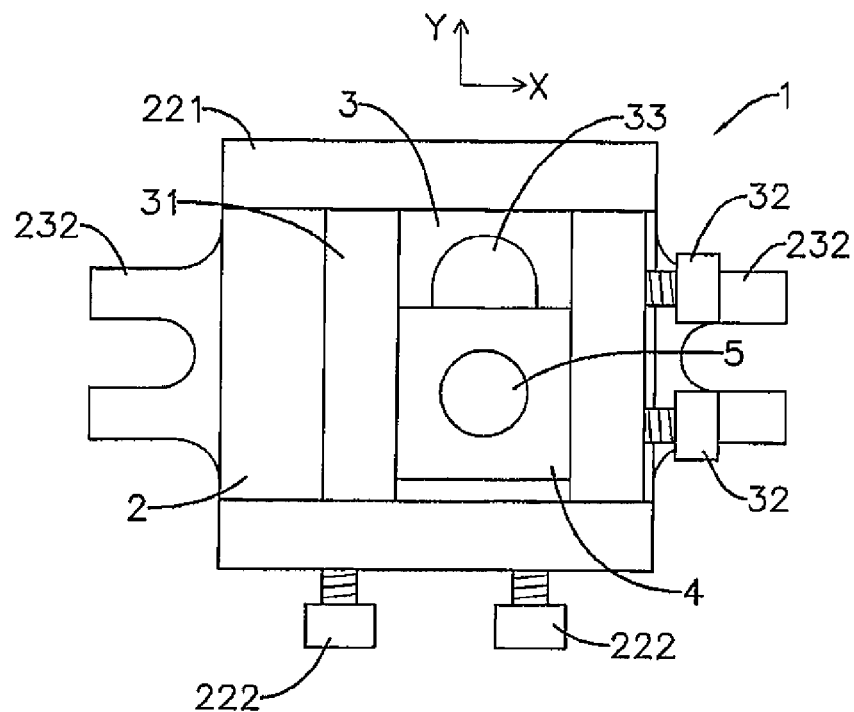
FIG. 3 and FIG. 4 are top view of acting schematic diagrams of the first preferred embodiment according to the invention.
Figure 4:
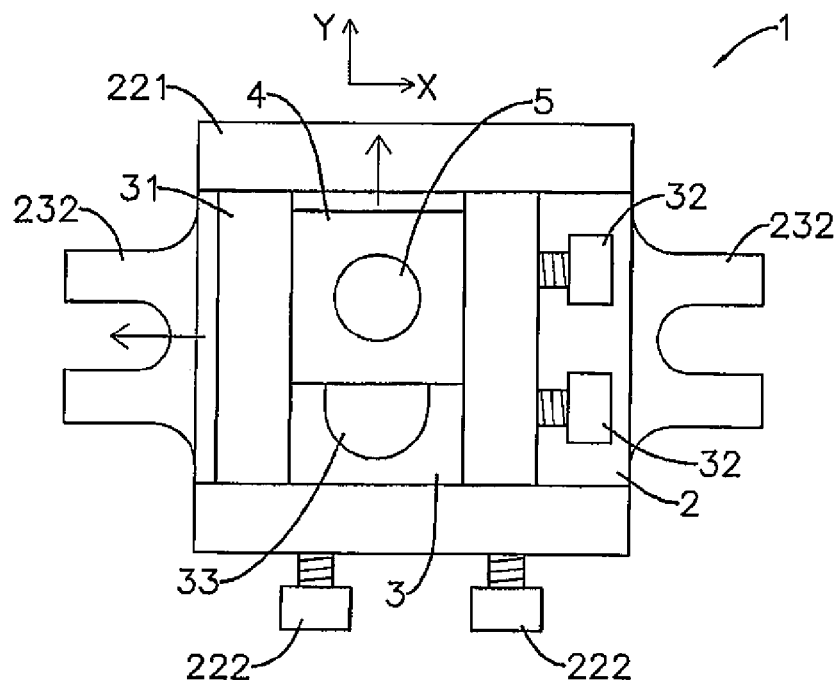

Please refer to FIG. 3 and FIG. 4 which are top views of acting schematic diagrams of the first preferred embodiment according to the invention.

The sliding seat 3 is slidably mounted on the first sliding rail 221 of the upper base portion 22 of the base 2, i.e. the sliding seat 3 can slide relative to the base 2 along the X-axis direction, as illustrated in FIG. 3 and FIG. 4. When the sliding seat 3 slides to a proper position, the first screws 222 can be used to be screwed against the sliding seat 3 so as to fix the sliding seat 3 in position. Similarly, the sliding block 4 is slidably mounted on the second rail 31 of the sliding seat 3, i.e. the sliding block 4 can slide relative to the sliding seat 3 along the Y-axis direction, as illustrated in FIG. 4. When the sliding block 4 slides to a proper position, the second screws 32 can be used to be screwed against the sliding block 4 so as to fix the sliding block 4 in position. The adjustable bolt 5 is screwed into the threaded hole 41 via the lower opening 231 and the upper opening 224 through the sliding slot 33 along the Z-axis direction, i.e. the screw bolt 5 can be screwed upwardly and downwardly along the Z-axis direction and people can twist the screw bolt 5 through the slot hole 21 by a wrench 6 (please refer to FIG. 6).

Figure 5:
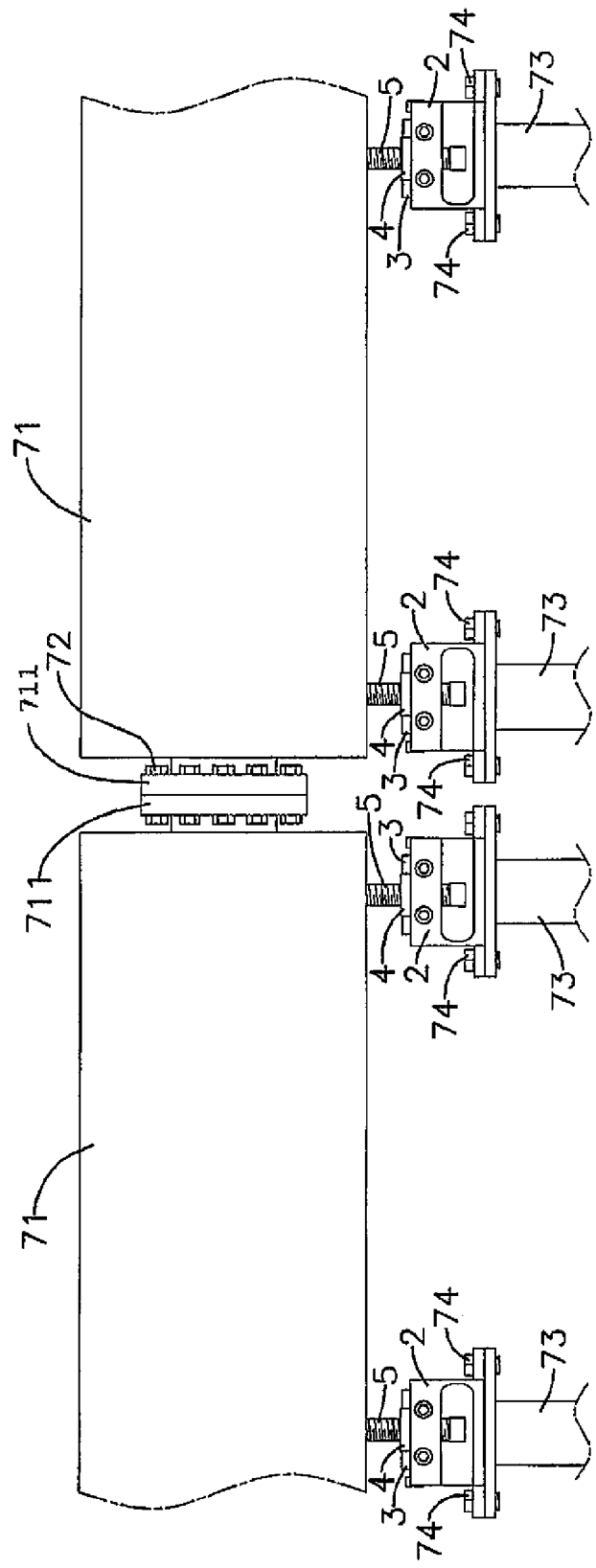
FIG. 5 is a schematic diagram of the first preferred embodiment in a use state according to the invention.
Figure 6:
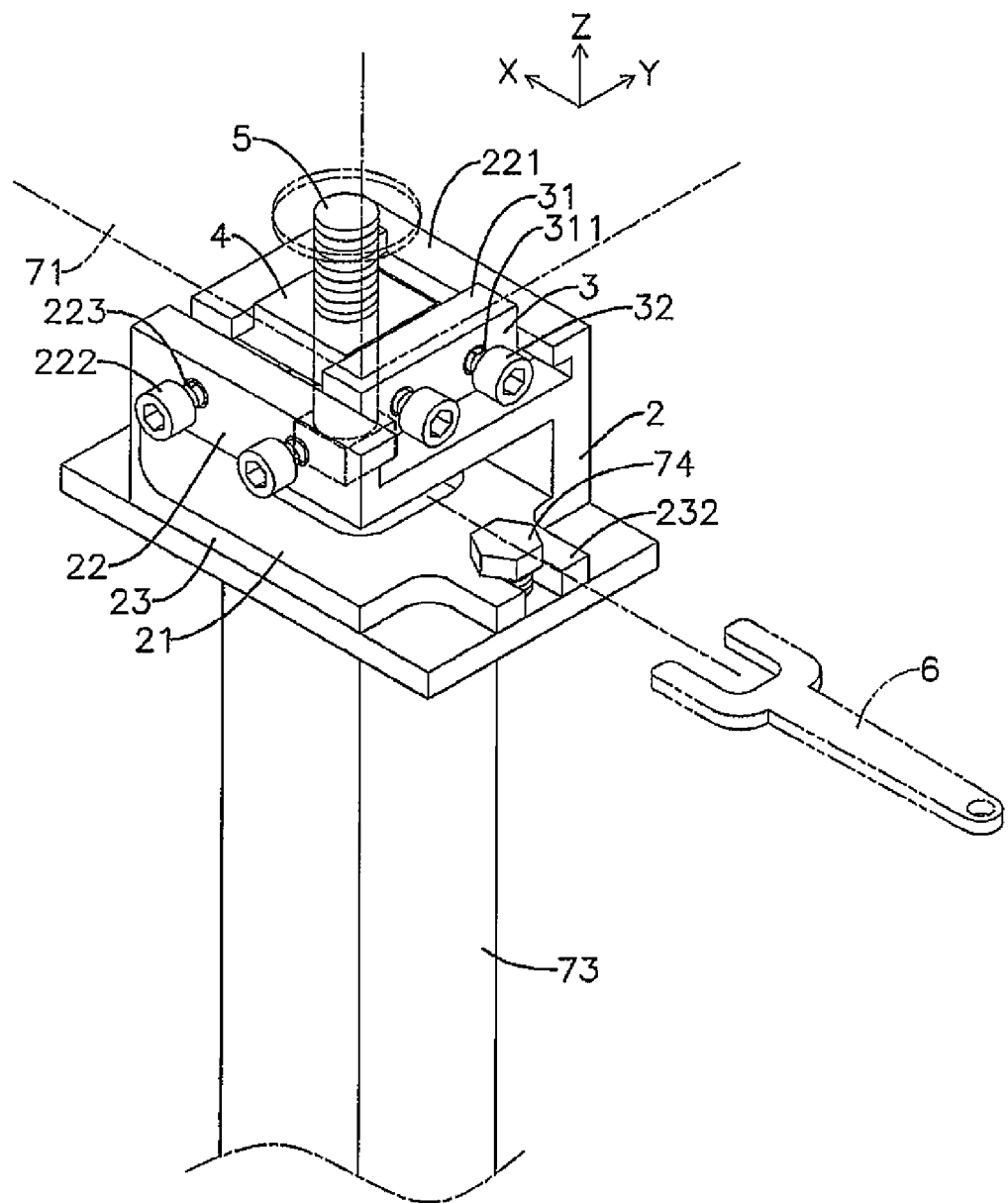
FIG. 6 and FIG. 7 are partial enlarged schematic diagrams of FIG. 5.
Figure 7:
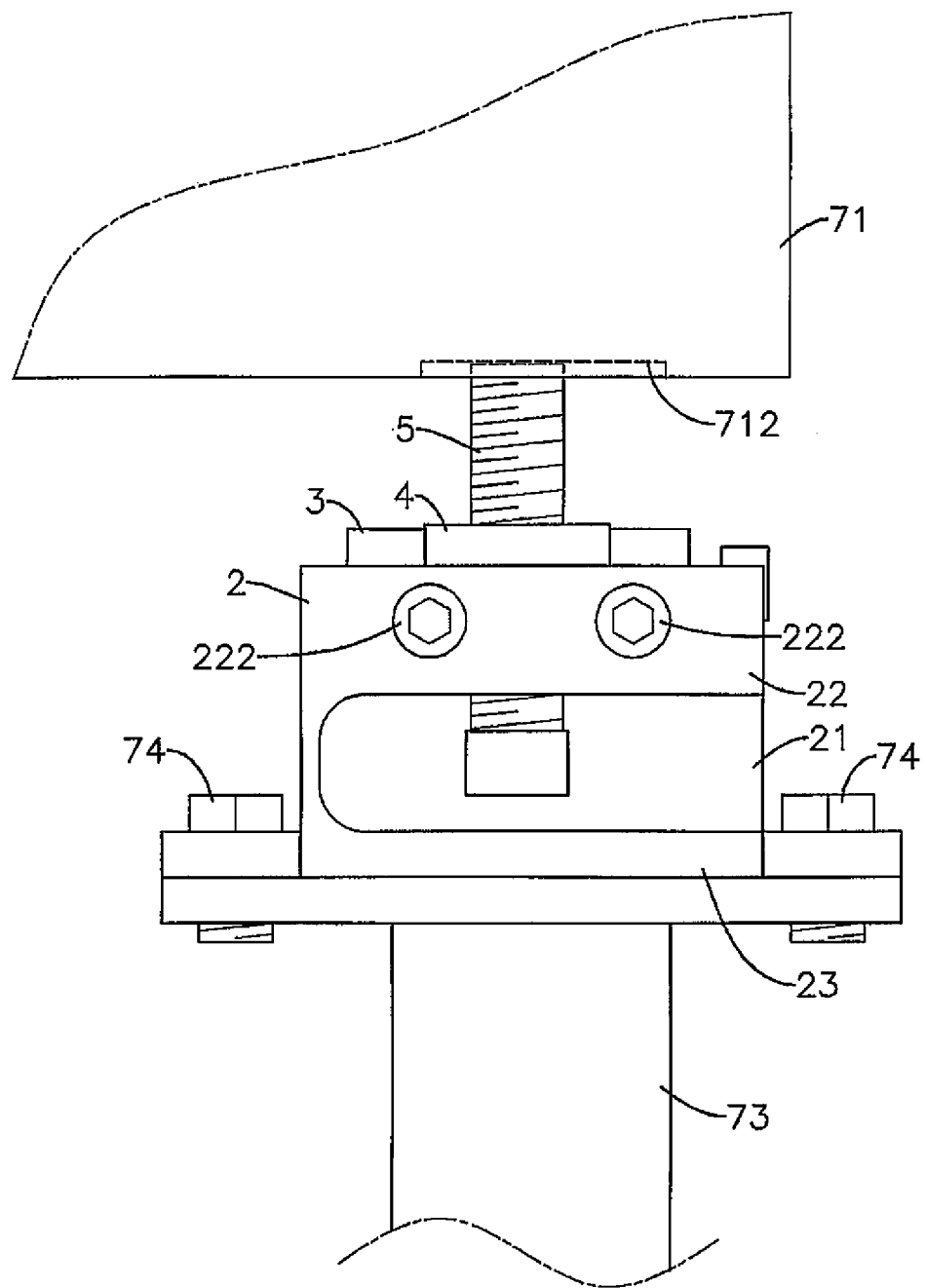

Please refer to FIG. 5 to FIG. 7, wherein FIG. 5 is a schematic diagram showing the use state of the first preferred embodiment according to the present invention and FIG. 6 and FIG. 7 are partial enlarged schematic diagrams of FIG. 5.

As illustrated in the figures, for example, if two or more chambers 71 (in vacuum process) are desired to be in an air-tight connection with each other in a semiconductor apparatus, the above-mentioned compact type fine-tuning lifter 1 can be used to facilitate this connection.

In detailed description, two chambers 71 with specific weights are placed on corner stands 73 by means of the compact type fine-tuning lifters 1 placed under the corners of the chamber 71, i.e. the compact type fine-tuning lifters 1 are locked on the corner stands 73 with the screws 74 via the fixing seat 232 and then the two chambers 71 are placed on the compact type fine-tuning lifters 1 and supported by the adjustable screw bolts 5, and flanges 711 of the two chambers 71 abut together, then the two chambers are air-tightly connected to each other with a plurality of screws 72 (e.g. M8 screws).

During the support, the adjustable screw bolt 5 (in the embodiment, M12 screw bolts are used, which can be modified as required) of each of the compact type fine-tuning lifters 1 placed under different corners of the chamber 71 can support the chamber of several hundreds of kilograms.

As described above, because of the manufacturing tolerance, the screw 72 is not always able to screw smoothly. At this time, the compact type fine-tuning lifter 1 can be used to perform the fine-tuning support so as to lift the chamber 71 partially to a suitable position such that the screw 72 can be screwed into the corresponding threaded hole smoothly. For example, the adjustable screw bolt 5 is used to support the chamber 71 with specific weight. During the operation, people can use the sliding seat 3 to perform the slidably fine tuning in the X-axis direction, and after performing the slidably fine tuning, the sliding seat 3 is fixed in position by screwing the first screws 222 such that the first screws 222 abut against the sliding seat 3, and/or use the sliding block 4 to perform the slidably fine tuning in the Y-axis direction and after performing the slidably fine tuning, the sliding block 4 is fixed in position by screwing the second screws 32 such that the second screws 32 abut against the sliding block 4, and/or twist the adjustable screw bolt 5 by a wrench 6 through the slot hole 21 to perform the slidably fine tuning of the height of the adjustable screw bolt 5 in the Z-axis direction.

During the fine-tuning process of the adjustable screw bolt 5 mentioned above, due to the performing of the fine tuning in one direction, fine change of the position in other directions may occur. Hence, the compact type fine-tuning lifter 1 is designed to perform the fine tuning in the X-axis, Y-axis and Z-axis directions.

In addition, adjustable screw bolt 5 performs the slidably fine tuning of its height in the Z-axis direction by rotating. In other word, the adjustable screw bolt 5 can continuously perform the tuning in a rotating manner (by thread). Accordingly, the adjustable screw bolt 5 as well as the whole compact type fine-tuning lifter 1 can achieve an adjusting accuracy of micrometer ($10^{-6}$ m) scale. As shown in FIG. 7, in order to support the chamber 71 in a specific position with the adjustable screw bolt 5, a slightly concave recess 712 can be formed at a place where the chamber 71 contacts the adjustable screw bolt 5 so that the adjustable screw bolt 5 can abut against the recess 712.

As described above, the compact type fine-tuning lifter 1 can perform the fine-tuning support in X-axis, Y-axis and Z-axis so that every screw 72 can screw two chambers 71 together smoothly to truly achieve the air-tight connection. This can prevent from various problems such as screw (e.g. screw 72) fracture causing the air-tight broken after conventional connection of the chambers which can only be lifted manually and laboriously.

In addition, due to the above-mentioned compact type fine-tuning lifter 1 which only needs a combination of simple mechanical elements (i.e. base 2, sliding seat 3, sliding block 4 and adjustable screw bolt 5) to achieve the goal of the fine-tuning support, the structure of the compact type fine-tuning lifter 1 is simple and can be miniaturized (e.g. a volume of 8 cm×5 cm×4 cm in an actual design) and has a low manufacturing cost. Further, after the above-mentioned compact type fine-tuning lifter 1 fine-tuningly supports the chamber 71, the compact type fine-tuning lifter 1 can remain on the apparatus to support the chamber 71 continuously due to the low manufacturing cost of the lifter.

In addition, the above-mentioned compact fine-tuning lifter 1 can also have a function of level adjustment. For example, after the above-mentioned compact fine-tuning lifters 1 are placed under the four corners of the apparatus which needs a level adjustment, user can perform the fine tuning of the compact type fine-tuning lifters 1 in the aforesaid four corners with a leveler in the X-axis, Y-axis and Z-axis, respectively, in the aforesaid adjusting mariner. Therefore, the goal of level adjustment can be achieved.

Further, the above-mentioned compact fine-tuning lifter 1 can be placed on the corner stand 73 horizontally as illustrated in FIG. 5, but not limited thereto. For example, the compact type fine-tuning lifter 1 can also be mounted by the fixing seat 232 on a longitudinal structure, such as a wall surface.

Figure 8:
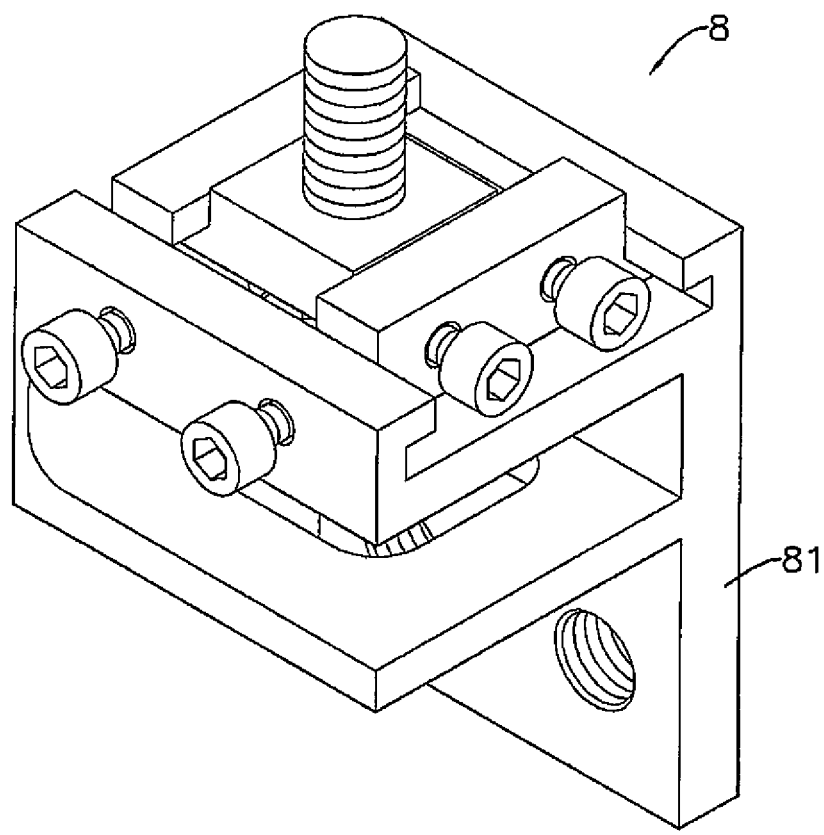
FIG. 8 is a perspective view of a second preferred embodiment according to the invention.

Please refer to FIG. 8 which is a perspective view of a second preferred embodiment according to the invention, showing that a fixing seat 81 of a compact type fine-tuning lifter 8 extends longitudinally (in the Z-axis direction). The longitudinally extending fixing seat 81 can be used to mount the compact type fine-tuning lifter 8 on the longitudinal structure, such as a wall surface (not shown in figures).

What is claimed is:

1. A compact type fine-tuning lifter, defining an X-axis, a Y-axis and a Z-axis directions, and the compact type fine-tuning lifter comprising:

a base, comprising a slot hole and at least one fixing seat, the slot hole being open along the X-axis and Y-axis directions and dividing the base into a upper base portion and a lower base portion along the Z-axis direction, the upper base portion including a first sliding rail, a plurality of first screws and an upper opening, the first sliding rail extending along the X-axis direction and including a plurality of first threaded holes, the first threaded holes being open along the Y-axis direction, the first screws being screwed into the first threaded holes respectively, the upper opening being open along the Z-axis direction, the lower base portion including a lower opening, the lower opening being open along the Z-axis direction and corresponding to the upper opening, the at least one fixing seat extending outwardly from the base;

a sliding seat, slidable mounted on the first sliding rail and abutting against the corresponding first screws, the sliding seat including a second sliding rail, a plurality of second screws and a sliding slot, the second sliding rail extending along the Y-axis direction and including a plurality of second threaded holes, the second threaded holes being open along the X-axis direction, the second screws being screwed into the second threaded holes respectively, the sliding slot being open along the Z-axis direction, extending along the Y-axis direction and corresponding to the upper opening;

a sliding block, slidably mounted on the second sliding rail and abutting against the corresponding second screws, the sliding block including a threaded hole which is open along the Z-axis direction; and an adjustable screw bolt, being threadedly connected to the threaded hole of the sliding block along the Z-axis direction via the lower opening and the upper opening through the sliding slot.

2. The compact type fine-tuning lifter according to claim 1, wherein the adjustable screw bolt is a M12 screw bolt.

3. The compact type fine-tuning lifter according to claim 1, wherein the at least one fixing seat extends outwardly from the base along the X-axis direction.

4. The compact type fine-tuning lifter according to claim 1, wherein the compact type fine-tuning lifter has an adjusting accuracy and the accuracy is in a micrometer scale.

* * * * *